US010681809B2

(12) United States Patent
Lee

(10) Patent No.: US 10,681,809 B2
(45) Date of Patent: Jun. 9, 2020

(54) COMPOSITE PRINTED CIRCUIT BOARD AND LAUNDRY TREATMENT APPARATUS HAVING THE SAME

(71) Applicant: LG ELECTRONICS INC., Seoul (KR)

(72) Inventor: Sunil Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/103,054

(22) Filed: Aug. 14, 2018

(65) Prior Publication Data
US 2019/0069405 A1 Feb. 28, 2019

(30) Foreign Application Priority Data

Aug. 29, 2017 (KR) .................. 10-2017-0109241

(51) Int. Cl.
H05K 1/11 (2006.01)
H05K 1/18 (2006.01)
H05K 3/36 (2006.01)
H05K 1/14 (2006.01)

(52) U.S. Cl.
CPC ............. H05K 1/115 (2013.01); H05K 1/14 (2013.01); H05K 1/182 (2013.01); H05K 3/366 (2013.01); H05K 2201/09063 (2013.01)

(58) Field of Classification Search
CPC .......... H05K 1/115; H05K 1/182; H05K 1/14; H05K 1/141; H05K 1/18; H05K 1/181; H05K 3/30; H05K 3/303; H05K 3/3405; H05K 3/341; H05K 3/36; H05K 3/361; H05K 3/365; H05K 3/366; H05K 3/40; H05K 3/403; H05K 2201/04; H05K 2201/044; H05K 2201/045; H05K 2201/048; H05K 2201/049; H05K 2201/09063; H05K 2201/09072; H05K 2201/09081; H05K 2201/09127; H05K 2201/09154; H05K 2201/0919; H05K 2201/0723; H05K 2201/10492; H05K 2201/105

See application file for complete search history.

(56) References Cited

U.S. PATENT DOCUMENTS

| | | | | | |
|---|---|---|---|---|---|
| 3,624,587 | A | * | 11/1971 | Conrad | H05K 3/366 174/263 |
| 6,496,384 | B1 | * | 12/2002 | Morales | H05K 3/366 29/830 |
| 6,775,151 | B2 | * | 8/2004 | Suzuki | H05K 3/366 361/736 |
| 7,940,530 | B2 | * | 5/2011 | Duppong | H05K 3/301 361/760 |
| 9,780,471 | B2 | * | 10/2017 | Van Rijswijk | H05K 1/141 |
| 2006/0070768 | A1 | * | 4/2006 | Lee | H05K 3/366 174/250 |
| 2008/0080152 | A1 | * | 4/2008 | Duppong | H05K 3/301 361/760 |

(Continued)

Primary Examiner — Ishwarbhai B Patel
(74) Attorney, Agent, or Firm — KED & Associates LLP

(57) ABSTRACT

Disclosed is a composite printed circuit board including a first printed circuit board (PCB) having a first circuit pattern mounted thereon, and a second PCB having a second circuit pattern mounted thereon, and the first PCB penetrates and is coupled to the second PCB so that the first circuit pattern is electrically connected to the second circuit pattern.

14 Claims, 7 Drawing Sheets (a)

(b)

(c)

(56) References Cited

U.S. PATENT DOCUMENTS

2011/0117757 A1* 5/2011 Seibold .................. H05K 1/141
  439/83
2013/0078825 A1* 3/2013 Wain ...................... H05K 3/366
  439/64
2017/0194731 A1* 7/2017 Van Rijswijk ......... H05K 1/141

* cited by examiner

[FIG 1]
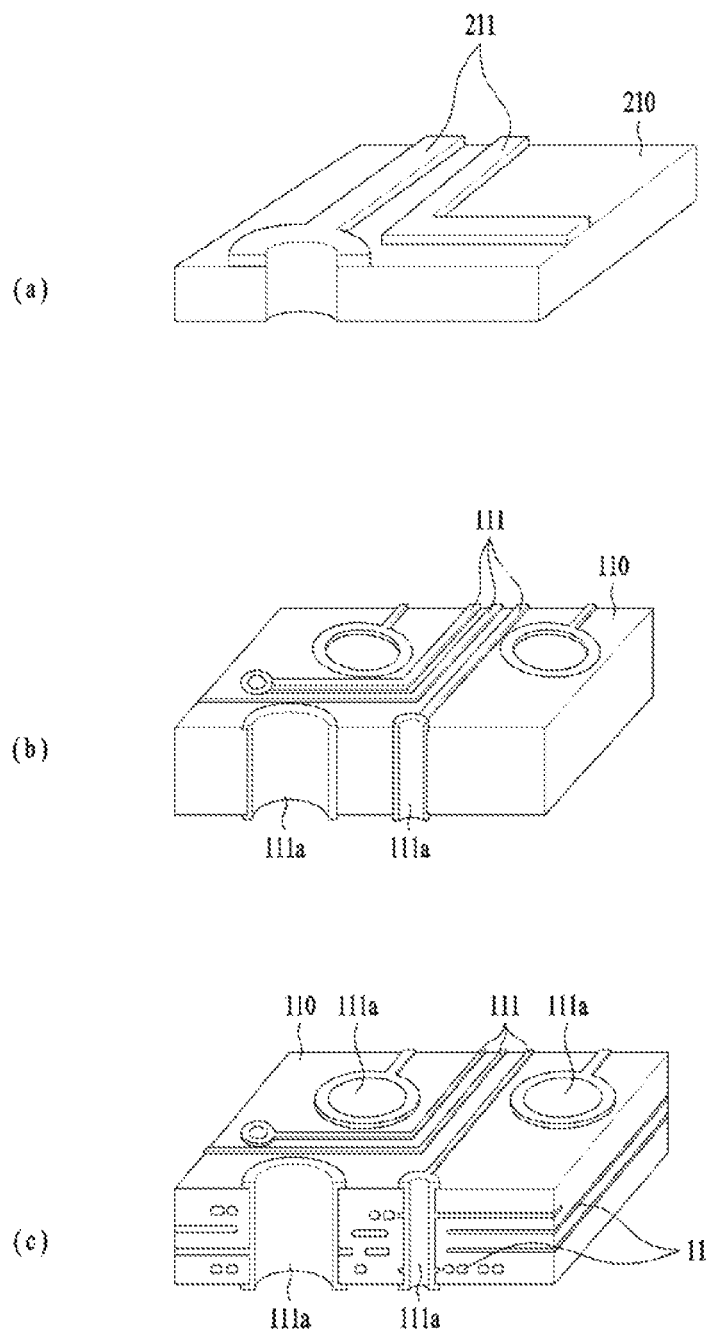

[FIG 2]
PRIOR ART
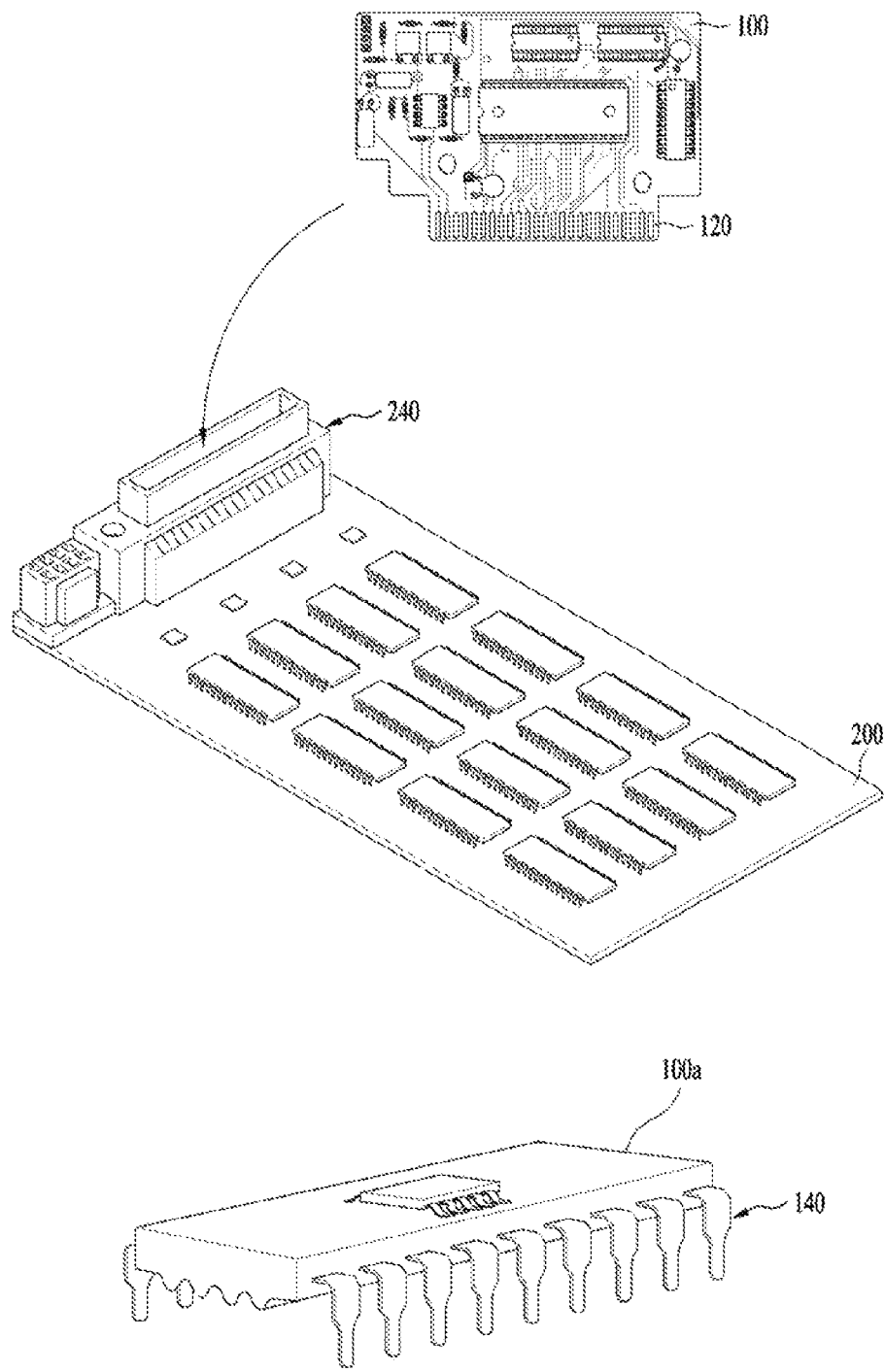

[FIG 3]
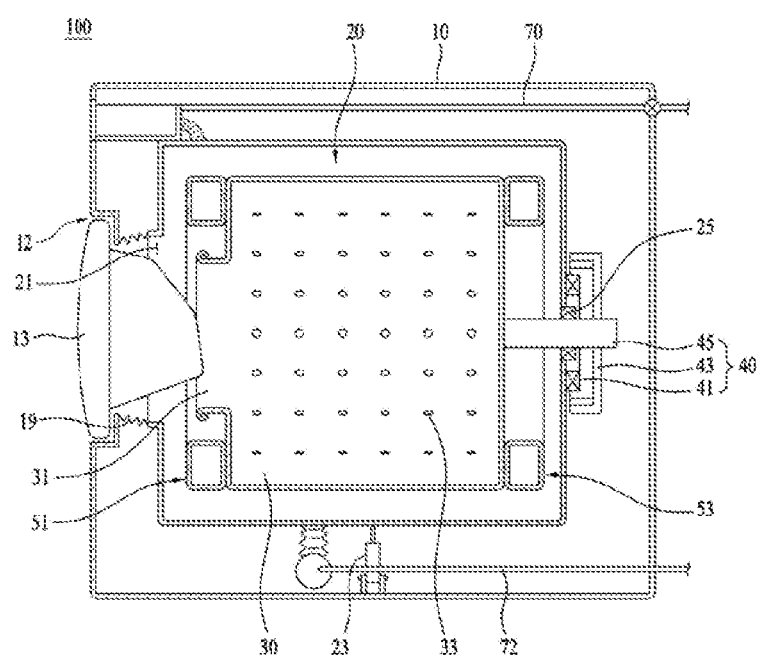

[FIG 4]
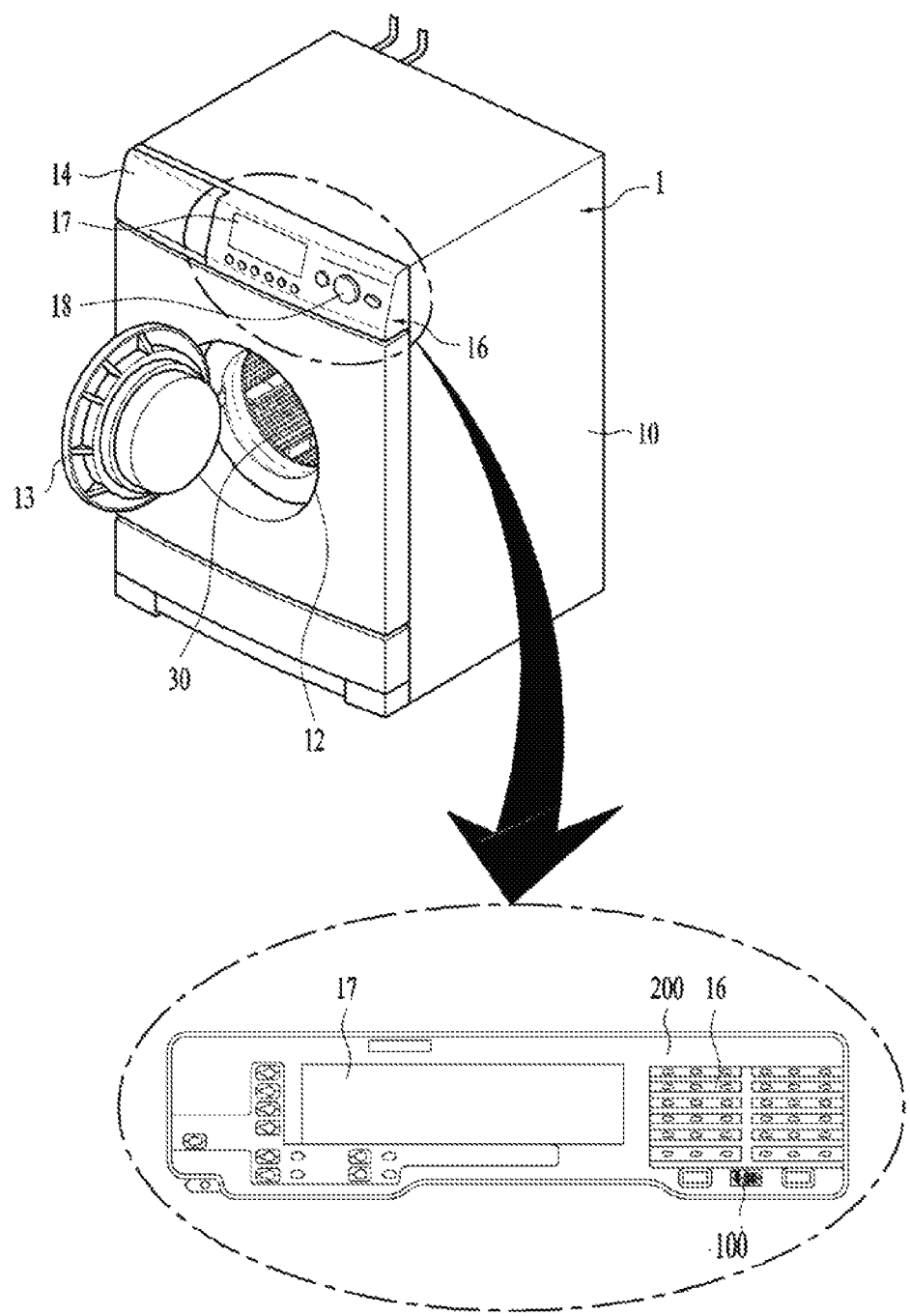

[FIG 5]
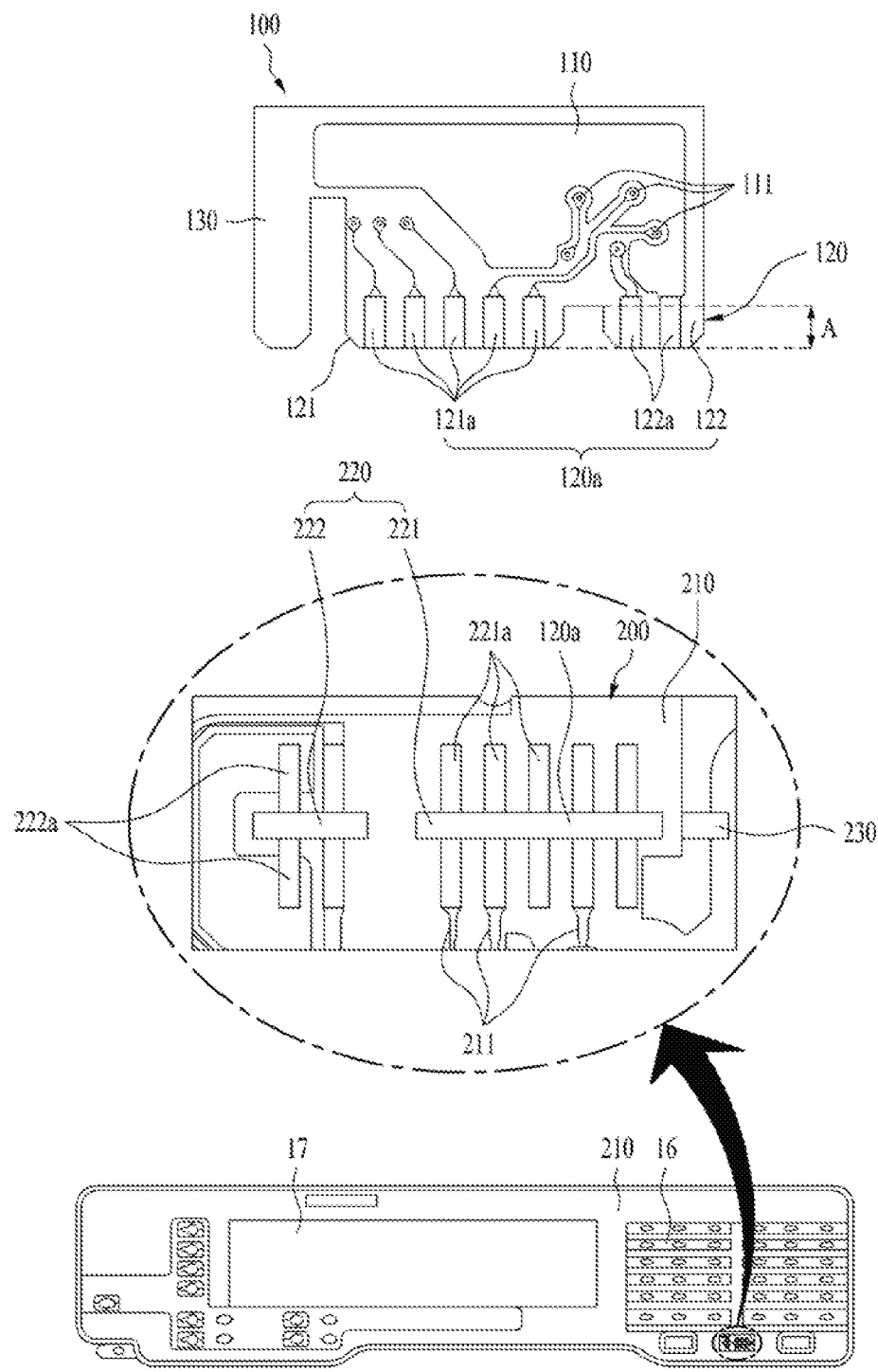

[FIG 6]
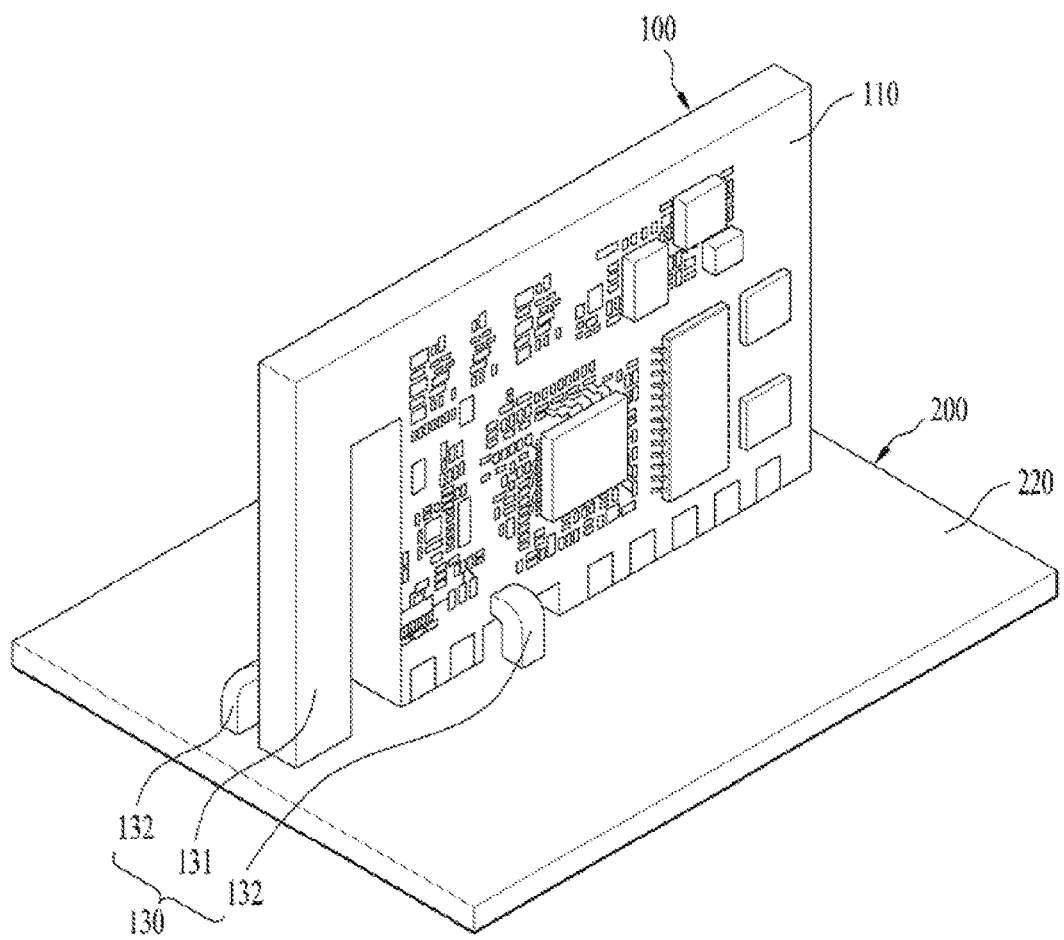

[FIG 7]
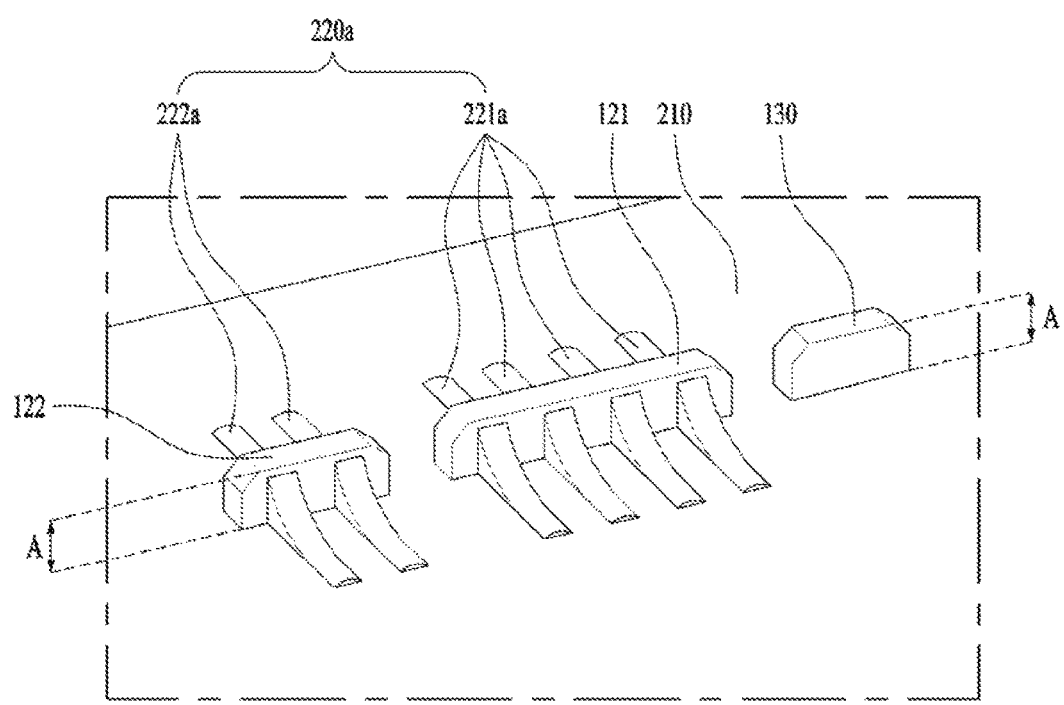

COMPOSITE PRINTED CIRCUIT BOARD AND LAUNDRY TREATMENT APPARATUS HAVING THE SAME

CROSS-REFERENCE TO RELATED APPLICATION(S)

This application claims the benefit of Korean Patent Application No. 10-2017-0109241, filed on Aug. 29, 2017, which is hereby incorporated by reference as if fully set forth herein.

BACKGROUND

1. Field

The present disclosure relates to a composite printed circuit board and a laundry treatment apparatus having the same.

2. Background

Printed circuit boards and laundry treatment apparatuses are known. However, they suffer from various disadvantages.

BRIEF DESCRIPTION OF THE DRAWINGS

Embodiments will be described in detail with reference to the following drawings in which like reference numerals refer to like elements, and wherein:

FIG. 1 illustrates different types of printed circuit boards;

FIG. 2 illustrates the coupling structure of a printed circuit board;

FIG. 3 illustrates the structure of a laundry treatment apparatus according to the present disclosure;

FIG. 4 illustrates the structure of a composite printed circuit board applied to the laundry treatment apparatus according to the present disclosure;

FIG. 5 illustrates respective components of the composite printed circuit board; and FIGS. 6 and 7 illustrate the coupling structure of the composite printed circuit board.

DETAILED DESCRIPTION

Hereinafter, exemplary embodiments of the present disclosure will be described in detail by way of example. In this specification, the same or similar elements are denoted by the same reference numerals even when they are described in relation to different embodiments, and a description thereof will not be repeated. The singular forms used in this specification are intended to include the plural forms as well, unless the context clearly indicates otherwise. In addition, a detailed description of related known functions and configurations incorporated herein will be omitted when the same may make the subject matter of the present disclosure rather unclear. In addition, it should be noted that the accompanying drawings are merely given to facilitate understanding of the embodiments disclosed in this specification, and the technical idea disclosed in this specification should not be interpreted as being limited by the accompanying drawings.

In general, a printed circuit board (PCB) is one of components that are fundamental to many fields of electronic products that are currently manufactured. Many electronic elements, such as a resistor and a capacitor, are mounted on such a printed circuit board, and many wires and the like are formed for connection between the respective electronic elements or for inputting and outputting a signal, a voltage, and the like.

The electronic elements on the printed circuit board are intensively mounted so as to process complicated calculations, and thus are provided so as to be electrically controlled. Therefore, when the printed circuit board is applied to a laundry treatment apparatus, the printed circuit board may be utilized to constitute an electronic component, such as a microcomputer, a control panel, a display unit having a display, a touch panel, or a key input unit.

FIG. 1 illustrates different types of printed circuit boards. Printed circuit boards may include a single-sided PCB having a circuit pattern mounted on only a single surface thereof (see FIG. 1(a)), a double-sided PCB having circuit patterns mounted on both surfaces thereof (see FIG. 1(b)), and a laminated PCB having circuit patterns additionally laminated therein (see FIG. 1(c)).

Here, the laminated PCB may be broadly regarded as a double-sided PCB because a circuit pattern is provided on both surfaces of the body.

Referring to FIG. 1(a), a single-sided PCB includes a body 210 constituting a main body and a circuit pattern 211 formed on one surface of the body. The body 210 is formed of a resin material that does not pass current, and the circuit pattern 211 may be provided as a copper plate, for example, so that current or electric signals may flow therethrough.

Since the single-sided PCB does not require a hole that penetrates through one surface and the other surface of the body 210 or a device that electrically connects one surface to the other surface thereof, and since the body 210 functions as a base, the single-sided PCB advantageously realizes very low manufacturing costs. However, the density or the area of the circuit pattern 211 needs to be higher than a certain level in order to perform complicated operations, which may deteriorate convenience of installation.

Referring to FIG. 1(b), a double-sided PCB includes a body 110 constituting a main body and circuit patterns 111 formed respectively on both surfaces of the body. Here, the double-sided PBC further includes through-holes 111a formed in the body in order to interconnect the circuit patterns 111 formed on both surfaces of the body 110. A conductive material may be mounted in the through-holes 111a so as to be electrically connected to the circuit patterns 111.

Referring to FIG. 1(c), a laminated PCB further includes circuit patterns 111b, which are inserted into or laminated inside the body 110 of the double-sided PCB. The circuit patterns 111b, laminated inside the body, and the circuit patterns 111, mounted on both surfaces of the body, may be connected to each other through through-holes 111a.

The double-sided PCB has an advantage in that it enables intensive computation even using a body 110 having a smaller area than that of the single-sided PCB. However, the cost of manufacturing the double-sided PCB is high.

Therefore, in order to utilize the advantages of both the single-sided PCB and the double-sided PCB, a combination of the single-sided PCB and the double-sided PCB may be used, instead of using only one of the single-sided PCB and the double-sided PCB.

Meanwhile, a home appliance such as a laundry treatment apparatus includes various electronic components, and the respective electronic components may have a difference in required load or in calculation-processing capability. Therefore, in consideration of cost efficiency and the like, the single-sided PCB is used for a general product, but the double-sided PCB may be used for a specific electronic product. In addition, the performance of a general microcomputer or a control panel may be enhanced as circuit patterns are concentrated. Accordingly, the single-sided PCB and the double-sided PCB may be combined with each other to form a single calculation processing device. In addition, a double-sided PCB or single-sided PCB, which is manufactured for a specific purpose, may be coupled to a double-sided or single-sided main PCB.

FIG. 2 illustrates the structure of a printed circuit board in which two PCBs are coupled to each other.

The composite printed circuit board may include a main PCB and an auxiliary PCB coupled to the main PCB. For example, the main PCB may be provided as a single-sided PCB 200, and the auxiliary PCB may be provided as a double-sided PCB 100. This is merely given for explanation, and the main PCB may be provided as a double-sided PCB 100, and the auxiliary PCB may be provided as a single-sided PCB 200.

The printed circuit board includes a coupling member 240, which serves to couple the double-sided PCB 100 to the single-sided PCB 200. The coupling member 240 is configured to allow the double-sided PCB 100 to be inserted thereinto in order to maintain the coupling force therebetween. However, the coupling member 240 increases the height or the volume of the PCB, which causes the installation space of the composite printed circuit board to be unnecessarily widened.

In order to solve the problem described above, a coupling pin 140 may be provided on an exposed portion of the circuit pattern 111 on the double-sided PCB 100 so as to induce coupling between the coupling pin 140 and the single-sided PCB 200. The coupling pin 140 has an effect of increasing the area in which soldering is possible, thereby maintaining the coupling force even if the coupling member 240 is not provided.

However, this is troublesome, since a process of installing the coupling pin 140 and a process of coupling the coupling pin 140 to the single-sided PCB 200 are added.

It is to be understood that both the foregoing general description and the following detailed description of the present disclosure are exemplary and explanatory and are intended to provide further explanation of the present disclosure as claimed.

As described above, a home appliance includes a plurality of electronic components coupled to each other, and circuit boards required to control the electronic components may perform differently. In this situation, when all of the circuit boards are configured as double-sided PCBs, costs may be excessively increased. On the other hand, when all of the circuit boards are configured as single-sided PCBs, this may cause an unnecessary increase in size or volume.

Therefore, it may be effective to use a double-sided PCB in order to control an electronic component that undergoes overload or requires complex calculation processing and to use a single-sided PCB in order to control an electronic part that performs relatively simple calculation processing.

The home appliance represents a device that is used to increase convenience of users at home and is electrically driven. For example, the home appliance may include a laundry treatment apparatus, a dishwasher, a refrigerator, or the like. FIGS. 3 and 4 illustrate a laundry treatment apparatus 100 as an example of the home appliance, but the present disclosure is not limited thereto, and may be equally or similarly applied to various home appliances having a composite printed circuit board. For convenience of description, the following description will be limited to the laundry treatment apparatus 1.

FIG. 3 illustrates the internal configuration of a laundry treatment apparatus to which a composite printed circuit board of the present disclosure may be applied.

Referring to FIG. 3, the laundry treatment apparatus 1 includes a cabinet 10, a tub 20 provided inside the cabinet 10 to store wash water therein, a drum 30 rotatably provided inside the tub 20, a motor 40 that rotates the drum 30, a water supply pipe 70 for the supply of wash water to the inside of the tub 20, and a drain pipe 72 for the discharge of the wash water from the tub 20 to the outside.

The cabinet 10 may define the external appearance of the laundry treatment apparatus 100, and may include an introduction opening 12, through which laundry may be introduced or discharged, and a door 13, which opens and closes the introduction opening 12. The door 13 may be rotatably connected to the front surface of the cabinet 10, and the introduction opening 12 may be opened and closed according to the rotation of the door 13.

FIG. 3 illustrates the laundry treatment apparatus in which the introduction opening 12 and the door 13 are formed on the front surface of the cabinet 10, but the present disclosure is not limited thereto, and the introduction opening 12 and the door 13 may be formed on the upper surface of the cabinet 10. Hereinafter, for convenience of description, only the case in which the introduction opening 12 and the door 13 are formed on the front surface of the cabinet 10 will be described.

The tub 20 may be provided inside the cabinet 10, and may define a space in which wash water is stored. For example, the tub 20 may have a cylindrical shape. The tub 20 may receive water from the outside through the water supply pipe 70, and may discharge the water to the outside through the drain pipe 72. Here, a water supply valve for the supply of water and a drain pump for drainage may be controlled by a microcomputer.

The tub 20 may include a tub opening 21, through which laundry may be introduced and discharged, and a tub support unit 23, which fixes the tub 20 inside the cabinet 10. The tub opening 21 may communicate with the introduction opening 12. The tub support unit 23 may be provided below the tub 20, and may attenuate vibrations generated in the tub 20. For example, the tub support unit 23 may include a damper, a spring, and the like.

The drum 30 may be rotatably provided inside the tub 20, and may include a drum opening 31, through which laundry may be introduced and discharged. For example, the drum 30 may have a cylindrical shape. The drum opening 31 may communicate with the introduction opening 12 and the tub opening 21. Accordingly, laundry may be introduced into the drum 30 by sequentially passing through the introduction opening 12, the tub opening 21, and the drum opening 31.

A gasket 19 may be provided between the introduction opening 12 in the cabinet 10 and the tub opening 21 in the tub 20. The gasket 19 may prevent the wash water inside the tub 20 from leaking to the cabinet 10, and may prevent vibrations generated in the tub 20 from being transmitted to the cabinet 10. For example, the gasket 19 may be formed of an elastic member.

A plurality of through-holes 33 may be formed in the circumferential surface of the drum 30 so as to communicate with the tub 20. The wash water accommodated inside the tub 20 may be supplied into the drum 30 through the through-holes 33, and the wash water inside the drum 30 may be discharged to the tub 20 through the through-holes 33.

The laundry treatment apparatus 100 may further include balancers 51 and 53 for attenuating vibrations generated in the drum 30. The balancers 51 and 53 may remove the eccentricity of the drum 30 that is caused when laundry is biased to one side inside the drum 30. That is, the balancers 51 and 53 may attenuate the imbalance of the drum 30 by moving to a specific position under the control of the microcomputer.

Here, the balancers may be provided respectively on the front and rear sides of the drum 30, or may be provided on either the front side or the rear side of the drum 30. For example, the balancers may include a front balancer 51 and a rear balancer 53, which are provided respectively on the front and rear sides of the drum 30. The balancers 51 and 53 may be a ball balancer, a liquid balancer, or the like.

The motor 40 is provided outside the tub 20, and may penetrate the rear surface of the tub 20 and be connected to the drum 30. The motor 40 may be fixed to the rear surface of the tub 20, and may convert electrical energy into mechanical energy. That is, the motor 40 may rotate the drum 30 by receiving current from the outside.

The motor 40 may include a stator 41 that generates a magnetic field, a rotor 43 that is rotated by the magnetic field inside the stator 41, and a rotating shaft 45 that passes through the rear surface of the tub 20 to connect the rotor 43 to the drum 30. For example, the motor 40 may be a brushless direct current (BLDC) motor. In this case, the stator 41 may be configured with a coil, and the rotor 43 may be a permanent magnet. The bottom surface of the tub 20 may be provided with a rotating shaft bearing 25, which rotatably supports the rotating shaft 45.

With this configuration, the laundry treatment apparatus may perform a washing process, a rinsing process, and a dehydration process by driving the motor 40 to stir the drum 30 in clockwise and counterclockwise directions or to rotate the drum 30 in a given direction after laundry is introduced into the drum 30 and water is supplied to the tub 20. In the case in which the laundry treatment apparatus is a dryer, a drying process may be performed by driving the motor 40 after laundry is introduced into the drum 30.

The laundry treatment apparatus may include a motor control circuit for driving the motor 40.

FIG. 4 illustrates the external structure of the laundry treatment apparatus according to the present disclosure and the structure of a composite printed circuit board for controlling the laundry treatment apparatus.

A detergent box 14 and a control panel 16 may further be provided on the front surface of the cabinet 10 to control the laundry treatment apparatus 1. Here, the control panel 16 may be configured with a composite printed circuit board.

The detergent box 14 and the control panel 16 may be disposed above the introduction opening 12.

The detergent box 14 may be provided so as to be pulled out forwards, and may store a powder detergent or a liquid detergent therein. For example, the detergent box may be of a drawer type.

The control panel 16 may be provided at one side of the detergent box 14. The control panel 16 may include an input unit 18 for receiving option information related to washing courses and laundry washing input from a user, and a display unit 17 for displaying the input information and the washing progress status. The display unit 17 may be a display unit having a liquid crystal, or may be configured as a touch panel to perform at least some functions of the input unit 18.

The input unit 18 may be of a button type or a rotary knob type, and may be provided to input an operation command of the laundry treatment apparatus 1.

The operation command may be a control command for causing the laundry treatment apparatus 1 to perform a washing process of removing foreign matter from laundry, a rinsing process of separating the foreign matter from the laundry, and a dehydration process of removing moisture from the laundry.

The control panel 16 may be provided as a microcomputer for controlling the laundry treatment apparatus 1. That is, the control panel 16 may be provided as a printed circuit board (PCB) to receive a voltage from an external source and control electric components of the laundry treatment apparatus 1. Here, since the electric components (hereinafter, load parts) are connected in parallel to the control panel 16, each of the input unit 18, the display unit 17, and the motor 40 may operate independently of each other.

FIG. 4 illustrates the case in which the control panel 16 includes a first PCB 100, which controls the display unit 17 and is provided with the input unit 18, and a second PCB 200, which controls the input unit 18.

The first PCB 100 may be provided as a single-sided PCB since the display unit 17 does not require very complicated calculation processing and since it may help secure sufficient space to provide the control panel 16.

The second PCB 200 may be provided as a double-sided PCB since the input unit 18 includes a plurality of keys, which needs to be controlled in order to select a washing course or an option, and needs to accurately recognize and process an input signal.

However, the case in which the first PCB 100 is provided as a double-sided PCB and the second PCB 200 is provided as a single-sided PCB is not excluded. For example, in order to control at least one of the motor 40, the water supply valve connected to the water supply pipe 70, the drain pump that drains the water in the tub 20, or the input unit 18, relatively complicated calculation processing may be required. This is because, for example, the amount of information to be input or output to or from the aforementioned components, or the number of times the information is input or output to or from the aforementioned components are relatively great. Therefore, the first PCB 100 may be provided as a double-sided PCB in order to control the motor 40, the water supply valve, and the drain pump. In this case, the composite printed circuit board of the present disclosure may be provided as a combination of a double-sided PCB and another double-sided PCB.

In conclusion, the following description will be based on the case in which the control panel 16 of the present disclosure is provided as a composite printed circuit board, and includes the second PCB 200, which controls the display unit 17, and the first PCB 100, which controls the input unit 18, but this is merely given as an embodiment, and the present disclosure is not limited as to the type or nature of the composite printed circuit board.

Since the printed circuit boards of the present disclosure are improved in performance and calculation-processing capability as they are more closely spaced, the PCBs may be directly coupled to each other. Here, the composite printed circuit board of the present disclosure may be provided so that it does not need to include a coupling member, into which any one PCB is inserted and fixed, or a coupling pin extending from the exposed copper plate of the PCB when a plurality of PCBs is coupled.

The composite printed circuit board of the present disclosure may be provided so that a plurality of PCBs is directly coupled for electrical communication therebetween. Thereby, through omission of any member for coupling the PCBs to each other, it is possible to simplify the manufacturing process, to reduce production costs, and to reduce the overall volume of the composite printed circuit board. In addition, when one PCB is provided as a single-sided PCB and the other PCB is provided as a double-sided PCB, it is possible to couple both the PCBs to each other and dispose the resulting combination at any place suitable for the application thereof.

The structure of the composite printed circuit board of the present disclosure will be described below with reference to FIGS. 5 and 6.

FIG. 5 is an exploded perspective view of the composite printed circuit board according to the present disclosure, and FIG. 6 illustrates the combined state of the composite printed circuit board.

The composite printed circuit board 16 of the present disclosure includes the first PCB 100 provided with a first circuit pattern 111 and the second PCB 200 provided with a second circuit pattern 211.

The first PCB 100 may penetrate and be coupled to the second PCB 200 so that the first circuit pattern 111 is electrically connected to the second circuit pattern 211.

In other words, according to the present disclosure, the first PCB 100 and the second PCB 200 may be directly coupled to each other without a separate structure for coupling the first PCB 100 and the second PCB 200 to each other.

The first PCB 100 includes a first body 110, on which the first circuit pattern 111 is formed, and a mounting portion 120 (or protrusion, tab) provided on one side of the first body 110 so as to penetrate and be coupled to the second PCB 200. The mounting portion 120 may include an exposed lead 120*a*, which is connected to the first circuit pattern 111 and is exposed from one surface or both surfaces of the mounting portion 120.

That is, the mounting portion 120 may serve to couple the first PCB 100 to the second PCB 200 and to electrically connect the first circuit pattern 111 of the first PCB 100 to the second circuit pattern 211 of the second PCB 200 via the exposed lead 120*a*.

The exposed lead 120*a* may be formed of a thin copper plate.

The second PCB 200 includes a second body 210 provided with the second circuit pattern 211, a mounting hole 220 (or recess, opening) formed in the second body 210 so that the mounting portion 120 is inserted thereinto, and a connection lead 220*a* provided around the mounting hole 220 so as to be connectable to the exposed lead 120*a*.

The mounting portion 120 may include a first mounting portion 121 provided at one side of the first body 110 and a second mounting portion 122 provided at the one side of the first body 110 so as to be spaced apart from the first mounting portion 121. The mounting hole 220 may include a first mounting hole 221, into which the first mounting portion 121 is inserted and coupled, and a second mounting hole 222, into which the second mounting portion 122 is inserted and coupled.

The first mounting portion 121 may include a first exposed lead 121*a* and the second mounting portion 122 may include a second exposed lead 122*a*. A plurality of exposed leads 120*a* may be provided, and the exposed leads 120*a* may be equidistantly spaced apart from each other.

A plurality of connection leads 220*a* may include a first connection lead 221*a* formed on the outer circumference of the first mounting hole 221 and a second connection lead 222*a* formed on the outer circumference of the second mounting hole 222.

That is, the first PCB 100 may be directly coupled to the second PCB 200 through the mounting hole 220, and the first PCB 100 and the second PCB 200 may be electrically connected to each other via soldering between the exposed leads 120*a* and the connection leads 220*a*.

The connection leads 220*a* may be formed of a copper plate, which is electrically connected to the second circuit pattern 211 and is exposed from one surface or both surfaces of the second body 210. In addition, the connection leads 220*a* may be provided to have a thickness that corresponds to the thickness of the exposed leads 120*a* and to have a distance therebetween that corresponds to that of the exposed leads 120*a*.

In addition, a plurality of mounting portions 120, i.e. two or more mounting portions 120 may be provided. Thereby, as compared with the case in which a single mounting portion 120 is provided, the plurality of mounting portions 120 may reduce the force required for coupling the first PCB 100 to the second PCB 200, or may secure a constant coupling height of the first PCB 100.

The direction in which and the position at which the first PCB 100 is coupled to the second PCB 200 may be determined in advance. Thus, the first PCB 100 and the second PCB 200 may not be coupled to each other in the state in which the left and right positions thereof are reversed, and if they are coupled to each other incorrectly, various problems, such as short-circuiting, current leakage, burnout, and calculation errors, may occur.

Therefore, when the first PCB 100 and the second PCB 2 are coupled to each other, it may be necessary for an operator to correctly recognize the coupling position and the coupling direction thereof.

To this end, the first mounting portion 121 and the second mounting portion 122 may be formed to have a difference in at least one of the length or the thickness thereof, the first mounting hole 221 may be provided so as to correspond to the first mounting portion 121, and the second mounting hole 222 may be provided so as to correspond to the second mounting portion 122.

Thereby, since the operator may recognize the position at which the mounting portion 120 and the mounting hole 220 correspond to each other, incorrect assembly of the first PCB 100 and the second PCB 200 may be prevented.

Meanwhile, the mounting portion 120 may extend from one side of the first body 110 so as to be longer than the thickness of the second body 210. That is, the protruding length A of the mounting portion 120 may be longer than the thickness of the second body 210. Thereby, when the first PCB 100 is coupled to the second PCB 200, the first PCB 100 may sufficiently penetrate and be coupled to the second PCB 200.

The length A may be sufficiently long to allow the mounting portion 120 to protrude from the opposite side of the second PCB 200 by at least 5 mm. This serves to allow the exposed lead 120*a* and the connection lead 220*a* to be easily coupled to each other via soldering in a soldering pot.

The first PCB 100 may completely penetrate the second PCB 200 to guide the exposed lead 120*a* and the connection lead 220*a* to be stably connected to each other.

Meanwhile, when the first PCB 100 penetrates and is coupled to the second PCB 200, all of the mounting portions 120 may be inserted at the same depth. However, there is the possibility that the mounting portions 120 may not be inserted to the same depth according to, for example, the angle and the direction in which the mounting portion 120 is inserted into the mounting hole 220, force imbalance, and frictional force, and that the operator may not recognize the resulting insertion failure. For example, the second mounting portion 122 may be inserted to a shallower depth and thus less securely coupled than the first mounting portion 121.

In order to prevent this, the first PCB 100 may include a fixing portion 130, which guides the first PCB 100 so as to be coupled to the second PCB 200 at a correct position.

The fixing portion 130 may include a horizontal fixing portion 131 (or first fixing portion, inline fixing portion), which guides insertion of the multiple mounting portions 120 of the first PCB 100 to the same depth. The horizontal fixing portion 131 may be coplanar relative to the mounting portion 120.

When coupling the first mounting portion 121 and the second mounting portion 122, the operator may further couple the horizontal fixing portion 131, thereby being capable of checking whether or not the first mounting portion 121 and the second mounting portion 122 are inserted to the same depth.

The second PCB 200 may include a fixing hole 230, into which the horizontal fixing portion 131 may be inserted and fixed.

In addition, the operator may check whether the horizontal fixing portion 131 is inserted more deeply or shallowly than the first mounting portion 121 or the second mounting portion 122, thereby intuitively determining whether or not the first mounting portion 121 and the second mounting portion 122 are inserted to the same depth.

To this end, the horizontal fixing portion 131 may be provided on one end or both ends of the first body 110 so as to be spaced apart from the mounting portion 120, thereby penetrating and being coupled to the second body 210. Since the horizontal fixing portion 131 is provided on the end of the first body 100, the operator may determine the degree to which the horizontal fixing portion 131 is inserted without checking the inserted length of the mounting portions 120, thereby intuitively determining the degree to which the first body 110 is inserted.

Moreover, the horizontal fixing portion 131 may also serve to support the first body 110 so as to prevent the first body 110 from moving in the thickness direction thereof when the horizontal fixing portion 130 is inserted.

Since the first PCB 100 includes no additional coupling member when it is coupled to the second PCB 200, the first PCB 100 may tilt in the thickness direction thereof even after it is inserted to a certain depth into the second PCB 200.

Due to this, the coupling degree of the connection lead 220a and the exposed lead 120a may be changed, and consequently, the coupling of the first PCB 100 and the second PCB 200 may be incomplete.

In order to prevent this, the fixing portion 130 may further include vertical fixing portions 132 (or second fixing portions, protruding fixing portion), which prevent the first body 110 from tilting in the thickness direction thereof relative to the second body 210. The vertical fixing portions 132 may protrude from a surface of the first body 110.

The vertical fixing portions 132 may extend in the thickness direction of the first body 110 so as to be in contact with one surface of the second body 210 or to penetrate and be coupled to the second body 210.

The vertical fixing portions 132 may penetrate and be coupled to the second body 210, but may be in contact with or supported by one surface of the second body 210. The reason for this is that, when the vertical fixing portions 132 are further inserted into the second body 210, the rigidity of the second body 210 may be deteriorated, and the area in which the second circuit pattern 211 is provided may be limited. Moreover, it is possible to reliably prevent the first body 110 from tilting when the vertical fixing portions 132 are supported by the second body 210. The vertical fixing portions 132 may protrude from one surface of the first body 110 so as to be in contact with the second body 210, or may protrude from both surfaces of the first body 110 so as to be in contact with the second body 210. Thereby, the vertical fixing portions 132 may determine the depth to which the first body 110 is inserted into the second body 210.

FIG. 7 illustrates the rear surface of the composite printed circuit board.

The first mounting portion 121 may be inserted into the first mounting hole 211, the second mounting portion 122 may be inserted into the second mounting hole 221, and the exposed lead 120a may be connected to the connection lead 220a via soldering, for example.

Here, the horizontal fixing portion 131 may not need to be connected to the second circuit pattern 211 of the second body 210, and thus may be simply inserted and fixed without soldering.

The first PCB 100 may be provided as a double-sided PCB having the first circuit pattern 111 mounted on both surfaces of the first body 110, and the second PCB 200 may be provided as a single-sided PCB having the second circuit pattern 211 mounted only on one surface of the second body 210.

This is because the single-sided PCB has a relatively large length or area, and therefore the double-sided PCB is easily coupled to and supported by the single-sided PCB.

In addition, as described above, the first PCB 100 may be provided to control the input unit 18, and the second PCB 200 may be provided to control the display unit 17. However, this may be changed at any time depending on the circumstances of the laundry treatment apparatus or other home appliance.

As is apparent from the above description, the present disclosure may provide a composite printed circuit board in which any one printed circuit board penetrates through and is coupled to the other printed circuit board so that the coupling force therebetween may be maintained without a separate coupling member, and a laundry treatment apparatus having the same.

The present disclosure may provide a composite printed circuit board, which guides a printed circuit board so as to be coupled to a predetermined position without tilting in a certain direction when the printed circuit board is coupled to the other printed circuit board, and a laundry treatment apparatus having the same.

The present disclosure may provide a composite printed circuit board, which is capable of adjusting the angle or the depth at which one printed circuit board is inserted into the other printed circuit board, and a laundry treatment apparatus having the same.

The present disclosure provides a composite printed circuit board, which is capable of reducing production costs by applying a double-sided PCB only to a portion that requires complex calculation and applying a single-sided PCB to a low-load portion, and a laundry treatment apparatus having the same.

Accordingly, the present disclosure is directed to a composite printed circuit board and a laundry treatment apparatus having the same that substantially obviate one or more problems due to limitations and disadvantages of the related art.

One object of the present disclosure is to provide a composite printed circuit board in which any one printed circuit board penetrates through and is coupled to the other printed circuit board so that the coupling force therebetween may be maintained without a separate coupling member, and a laundry treatment apparatus having the same.

Another object of the present disclosure is to provide a composite printed circuit board, which guides a printed circuit board so as to be coupled to a correct position without tilting in a certain direction when the printed circuit board is coupled to the other printed circuit board, and a laundry treatment apparatus having the same.

A further object of the present disclosure is to provide a composite printed circuit board, which is capable of reducing production costs by applying a double-sided PCB only to a portion that requires complex calculation and applying a single-sided PCB to a low-load portion, and a laundry treatment apparatus having the same.

Additional advantages, objects, and features will be set forth in part in the description which follows and in part will become apparent to those having ordinary skill in the art upon examination of the following or may be learned from practice. The objectives and other advantages may be realized and attained by the structure particularly pointed out in the written description and claims hereof as well as the appended drawings.

To achieve these objects and other advantages in accordance with the purpose of the disclosure, as embodied and broadly described herein, in accordance with one aspect of the present disclosure, a composite printed circuit board includes a first printed circuit board (PCB) including a first circuit pattern mounted thereon, and a second PCB including a second circuit pattern mounted thereon, wherein the first PCB penetrates and is coupled to the second PCB so that the first circuit pattern is electrically connected to the second circuit pattern.

The first PCB may include a first body provided with the first circuit pattern, a mounting portion provided on one side of the first body so as to penetrate and be coupled to the second PCB, and an exposed lead connected to the first circuit pattern and exposed from one surface or both surfaces of the mounting portion, and the second PCB may include a second body provided with the second circuit pattern, a mounting hole formed in the second body to allow the mounting portion to be inserted thereinto, and a connection lead provided outside the mounting hole so as to be connectable to the exposed lead.

The mounting portion may include a first mounting portion provided on the one side of the first body and a second mounting portion provided on the one side of the first body and spaced apart from the first mounting portion, and the mounting hole may include a first mounting hole, into which the first mounting portion is inserted and coupled, and a second mounting hole, into which the second mounting portion is inserted and coupled.

The first mounting portion and the second mounting portion may have a difference in at least one of a length or a thickness thereof, the first mounting hole may be provided so as to correspond to the first mounting portion, and the second mounting hole may be provided so as to correspond to the second mounting portion.

The mounting portion may extend from the one side of the first body so as to be longer than a thickness of the second body.

The mounting portion may include a plurality of mounting portions and the mounting hole includes a plurality of mounting holes, and the first PCB may further include a fixing portion configured to guide the first PCB so as to be inserted into and coupled to the second PCB at a correct position.

The fixing portion may include a horizontal fixing portion configured to guide the mounting portions so as to be inserted to the same depth.

The horizontal fixing portion may be provided on one end or both ends of the first body so as to be spaced apart from the mounting portions, and may penetrate and be coupled to the second body.

The fixing portion may include a vertical fixing portion configured to prevent the first body from tilting in a thickness direction relative to the second body.

The vertical fixing portion may extend from the first body in the thickness direction so as to be in contact with one surface of the second body or to penetrate and be coupled to the second body.

The first circuit pattern of the first PCB may be mounted on both surfaces of the first body, and the second circuit pattern of the second PCB may be mounted only on one surface of the second body.

In accordance with another aspect of the present disclosure, a laundry treatment apparatus includes a cabinet defining an external appearance of the apparatus, a laundry accommodating unit provided inside the cabinet to accommodate laundry therein, a display unit configured to display an operation state of the laundry accommodating unit, and an input unit configured to input an operation command to the laundry accommodating unit, wherein a first PCB controls the input unit, and a second PCB controls the display unit.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present disclosure.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A composite printed circuit board comprising:
    a first printed circuit board (PCB) that includes a first body provided with a first circuit pattern, and a mounting portion provided on one side of the first body; and
    a second PCB that includes a second body provided with a second circuit pattern, and a mounting hole provided on the second body,
    wherein the mounting portion is configured to be inserted into the mounting hole to physically couple the first PCB to the second PCB and to electrically connect the first circuit pattern to the second circuit pattern,
    wherein the first PCB further includes:
        a protruding fixing portion that protrudes from a surface of the first body, wherein the protruding fixing portion is configured to prevent the first body from tilting in a thickness direction of the first body, and
        an inline fixing portion provided on one of both ends of the first body to guide insertion of the mounting portion to the mounting hole at a prescribed position, wherein the inline fixing portion is configured to guide insertion of the plurality of mounting portions to a same depth,
    wherein the second PCB further includes a fixing hole configured to receive the inline fixing portion,
    wherein the mounting portion includes a first mounting portion provided on the one side of the first body and a second mounting portion provided on the one side of the first body, and the second mounting portion being spaced apart from the first mounting portion, and
    wherein the mounting hole includes a first mounting hole corresponding to the first mounting portion and a second mounting hole corresponding to the second mounting portion,
    wherein a width of the first mounting portion is greater than a width of the second mounting portion.

2. The composite printed circuit board according to claim 1, wherein the first PCB includes:
    an exposed lead connected to the first circuit pattern and provided to be exposed on one surface or both opposing surfaces of the mounting portion.

3. The composite printed circuit board according to claim 2, wherein the second PCB includes:
    a connection lead provided adjacent to the mounting hole and configured to connect to the exposed lead.

4. The composite printed circuit board according to claim 3, wherein the mounting portion is provided to extend from the first body such that a length of the mounting portion is longer than a thickness of the second body.

5. The composite printed circuit board according to claim 3, wherein the mounting portion includes a plurality of mounting portions, and the mounting hole includes a plurality of mounting holes.

6. The composite printed circuit board according to claim 5, wherein the inline fixing portion is provided on one or both lateral ends of the first body and spaced apart from the mounting portions, wherein the inline fixing portion is inserted into and coupled to the second body.

7. The composite printed circuit board according to claim 5, wherein the inline fixing portion is co-planar to the mounting portions.

8. The composite printed circuit board according to claim 3, wherein the connection lead has a prescribed width that corresponds to a width of the exposed lead and is provided adjacent to the exposed lead to accommodate solder between the connection lead and the exposed lead.

9. The composite printed circuit board according to claim 8, wherein the connection lead includes a plurality of leads positioned adjacent to corresponding ones of a plurality of exposed leads.

10. The composite printed circuit board according to claim 8, wherein the connection lead is provided on a bottom side of the second body corresponding to the exposed leads that protrude through the second body.

11. The composite printed circuit board according to claim 1, wherein the protruding fixing portion protrudes from the first body perpendicular to the mounting portions.

12. The composite printed circuit board according to claim 11, wherein the protruding fixing portion has a prescribed shape such that the protruding fixing portion extends to contact the second body.

13. The composite printed circuit board according to claim 12, wherein the protruding fixing portion is configured to penetrate the second body.

14. The composite printed circuit board according to claim 1, wherein the first circuit pattern of the first PCB is provided to be mounted on both surfaces of the first body, and
wherein the second circuit pattern of the second PCB is provided to be mounted only on one surface of the second body.

\* \* \* \* \*